(12) United States Patent
Verweg et al.

(10) Patent No.: US 7,652,895 B2
(45) Date of Patent: Jan. 26, 2010

(54) ELECTRICALLY INSULATING BODY, AND ELECTRONIC DEVICE

(75) Inventors: Fransiscus Gerardus Coenradus Verweg, Heerlen (NL); Johannus Wilhelmus Weekamp, Eindhoven (NL)

(73) Assignee: TPO Displays Corp., Chu-Nan (TW)

( * ) Notice: Subject to any disclaimer, the term of this patent is extended or adjusted under 35 U.S.C. 154(b) by 693 days.

(21) Appl. No.: 10/510,302

(22) PCT Filed: Apr. 10, 2003

(86) PCT No.: PCT/IB03/01343

§ 371 (c)(1),
(2), (4) Date: Oct. 6, 2004

(87) PCT Pub. No.: WO03/086034

PCT Pub. Date: Oct. 16, 2003

(65) Prior Publication Data

US 2005/0142917 A1    Jun. 30, 2005

(30) Foreign Application Priority Data

Apr. 11, 2002  (EP) ................................. 02076427
Aug. 5, 2002   (EP) ................................. 02078210

(51) Int. Cl.
*H05K 7/00* (2006.01)
(52) U.S. Cl. .................... 361/776; 361/778; 361/779
(58) Field of Classification Search ............... 361/773, 361/777, 807, 778, 779; 174/260
See application file for complete search history.

(56) References Cited

U.S. PATENT DOCUMENTS

| 5,440,452 | A   | * | 8/1995  | Kitahara ..................... 361/773 |
| 5,622,522 | A   | * | 4/1997  | Tan et al. .................... 439/607 |
| 5,755,822 | A   |   | 5/1998  | Scheffner |
| 5,994,648 | A   |   | 11/1999 | Glovatsky et al. |
| 6,037,641 | A   |   | 3/2000  | Goel |
| 6,278,178 | B1  | * | 8/2001  | Kwon et al. ................. 257/684 |
| 6,486,412 | B2  | * | 11/2002 | Kato .......................... 174/260 |
| 6,905,344 | B2  | * | 6/2005  | Nishio et al. ................. 439/68 |
| 6,939,172 | B2  | * | 9/2005  | Lu ............................. 439/607 |

(Continued)

FOREIGN PATENT DOCUMENTS

DE      2920091 A1     11/1980

(Continued)

*Primary Examiner*—Dean A. Reichard
*Assistant Examiner*—Abiy Getachew
(74) *Attorney, Agent, or Firm*—Liu & Liu (57) ABSTRACT

The invention relates to an electric insulating body (2) provided with a conductor pattern (1) and an electronic device (10) comprising such a body (2) and at least one electronic element (30). According to the invention, the body (2) has first and second faces (2A, 2B) in between of which an angle of less than 180 degrees is defined, wherein the conductor pattern (1) of the body (2) extends over both faces (2A, 2B), which body (2) carries both the conductor pattern (1) and the electronic element (30). The conductor pattern (1) comprises strip-shaped regions (1A) and regions (1B) with a larger width than the strip-shaped regions (1A), which regions (1B) are suitable for electrically contacting the electronic element (30). The electronic element (30) is, for example, a camera. The device (10) with such a camera is particularly suitable for use in a mobile communication apparatus.

13 Claims, 7 Drawing Sheets

U.S. PATENT DOCUMENTS

| | | | |
|---|---|---|---|
| 7,053,381 B2 * | 5/2006 | Shaw et al. | 250/370.11 |
| 7,067,356 B2 * | 6/2006 | Towle et al. | 438/122 |
| 7,078,788 B2 * | 7/2006 | Vu et al. | 257/668 |
| 7,179,126 B2 * | 2/2007 | Chen | 439/607 |
| 2005/0142917 A1 * | 6/2005 | Verweg et al. | 439/212 |
| 2005/0237424 A1 * | 10/2005 | Weekamp et al. | 348/373 |

FOREIGN PATENT DOCUMENTS

| | | |
|---|---|---|
| DE | 3246661 A1 | 6/1984 |
| JP | 02-042738 | 2/1990 |
| JP | 2001-245186 | 9/2001 |
| WO | WO0163926 | 8/2001 |

* cited by examiner

ELECTRICALLY INSULATING BODY, AND ELECTRONIC DEVICE

The invention relates to an electrically insulating body provided with a conductor pattern. The invention also relates to an electronic device provided with an electronic element and an electrically insulating body provided with a conductor pattern.

The invention further relates to an apparatus for mobile communication provided with an electronic device.

Such an electrically insulating body is, for example, a printed circuit board, on which a conductor pattern is present at a first side. It is also possible that one or more conductors is or are present at the second side or in conductive layers inside the body. The known body is a carrier on which one or several electronic elements is or are provided by means of solder or an anisotropically conducting glue.

The trend in the electronics industry is towards miniaturization of devices. This trend manifests itself inter alia in efforts to integrate a wide variety of components. Examples are capacitors and resistors which are integrated into the printed circuit board, and multichip modules in which several semiconductor devices and other electronic elements are present. Said trend implies that the standard construction of a device in which a printed circuit board serves as the carrier of the components becomes less suitable. The use of a multichip module in fact makes the function of the printed circuit board as an interconnect less important. In addition, the board is no longer the primary carrier of the components.

There does exist a wish to comply with the miniaturization requirement in combination with an increased functionality. It is desirable here for the electrically insulating body thus formed to be simple in its manufacture.

It is accordingly a first object of the invention to provide an electrically insulating body of the kind mentioned in the opening paragraph which is suitable for carrying and interconnecting components and which complies with the requirements as regards miniaturization and enhanced functionality.

It is a second object of the invention to provide an electronic device of the kind mentioned in the opening paragraph, which is based on an improved electrically insulating body and in which several functions of an apparatus can be integrated.

It is a third object of the invention to provide an apparatus comprising the electronic device according to the invention.

The first object is achieved in that the insulating body is provided with a first and a second side, between which an enclosed angle is present of substantially less than 180°, and in that the conductor pattern extends at the first and the second side. The conductor pattern comprises a number of strip-shaped conductors provided each with at least one region of larger dimensions than the width of the strip-shaped conductors. Said regions are suitable for electrical contacting of electronic elements to be assembled together with the insulating body, said body acting as a carrier of the conductor pattern and as a carrier of the elements.

The conductor pattern in the electrically insulating body of the invention is present at the surface and extends over more than one side. The body, in contrast to a printed circuit board, is not planar, but substantially block-shaped. This renders it suitable for use as a carrier of modules and electronic elements. Since the conductor pattern extends on several sides, the elements can be placed in locations which are most favorable in view of their functions or in view of miniaturization. If the conductor pattern is to carry signals at higher voltages, moreover, the design of the conductor pattern may be chosen such that the legal safety requirements are complied with. The shape of the body may then be determined as desired in that a molding technique and a mold are used for manufacture. Manufacture with a mold in addition renders it possible for the sides to be very flat, which is desirable for assembling the elements. The regions of larger dimensions offer an opportunity for electrical contacting of the electronic elements, for example with solder, glue, or metal.

In addition, there are substantially no conductors inside the body. This is not necessary because connections can be provided over the sides, and the lower side may also be utilized for connections, and because the number of electronic elements to be interconnected can remain limited thanks to the integration. The conductors may then have small dimensions because the layer in which the conductor pattern is defined has a small thickness. This layer with the conductor pattern is present on a temporary carrier during manufacture of the device, which carrier is subsequently removed. The same conductor pattern may alternatively comprise conductors of comparatively great width. It is possible then that the conductor pattern comprises conductors with a width of 10 μm and of 500 μm. The absence of any conductors inside the body does not exclude that the surface of the body is covered with any protective layer, if so desired. If neither excludes that some of the conductors, particularly those with a small width (e.g. 5-20 μm) have been covered by a surface layer of the body.

In a favorable embodiment, a cavity or opening is present in the body for mounting an electronic component. It can be ensured by means of the cavity or opening that the electronic element is located at least partly, and preferably as much as possible, within the dimensions of the body. The total bulk of the body with the electronic elements is considerably reduced thereby. An additional advantage is that the mechanical joint between the body and the element can be realized in a simple manner. Not only can the shape of the body be chosen such that the element is clamped in the body, but a seal by means of a glue layer or a synthetic resin capable of flowing between the body and the element is also possible. The cavity then offers the advantage that a glue layer, for example, may be provided in the cavity without this glue spreading over the entire surface of the body.

In a further embodiment, the cavity has a bottom and a side wall, the conductor pattern extending over the side wall and optionally over the bottom of the cavity, while a connection region for electrical contacting of the electronic element is present in the cavity. The presence of the conductor pattern in the cavity ensures a simple electrical contacting. This is favorable, for example, for components such as a speaker and a buzzer for a mobile telephone.

In another further embodiment, the opening extends from the first side through to a third side facing away from the first side, such that a first component can be placed at the first side and a second component can be placed at the third side, which components together with the interposed body define an electronic element. The electronic element is, for example, a camera of which a lens is the first component and a photosensitive semiconductor element the second component. The distance between the lens and the semiconductor element is then defined by the distance between the first and the third side of the insulating body.

In a practical implementation thereof, at least a number of the strip-shaped conductors is provided with respective regions at respective ends, which regions act as connection regions and are located in a closed, preferably rectangular arrangement. Said closed arrangement then surrounds the opening at the first side. The connection regions can be connected to connection regions of the semiconductor element through the provision of solder or metal connection pieces (bumps). This modification is practical also for other embodiments without openings, such as where a semiconductor element is integrated into the electrically insulating body.

It is favorable, furthermore, that the body has, in addition to the second side, a third side which faces away from the first side, and that the conductor pattern extends from the first side over the second side onto the third side. Especially if the body is used for assembling together several electronic elements, it is important to utilize both the first side and the third side. An example is that the first side is the front, where the functional element is present, while the third side is the rear, where the electronic components required for the function and conductive connections are defined. Another possibility is that the elements are present at the first side and at the third side. The second side is preferably provided with a recessed portion in which the conductors are present so as to avoid damage to the conductors.

There are various possibilities for contacting the body with other components. First of all, connection regions with a greater diameter may be defined for external contacting. The contacting may be realized with solder, glue, or metal. Then the body provides sufficient space for mounting an antenna or defining an antenna in the conductor pattern. There is also sufficient flexibility for integrating a cavity with connection regions for a battery. It is favorable in that case if the conductor pattern lies slightly recessed with respect to the first side. Such a recessed location is realized, for example, by a method in which the layer of the conductor pattern is present on a temporary carrier which can be selectively etched with respect to the layer of the conductor pattern. A slight underetch relative to the conductor pattern may then be provided, whereby space is created, This space is filled with the insulating material to be provided, for example synthetic resin, resulting in the recessed situation.

In a favorable modification of the contacting, at least a number of the strip-shaped conductors have respective strip-shaped ends, said ends being at least substantially oriented in parallel and present at the first side. This modification is very suitable for providing a flexible foil with conductor tracks. The connection between the conductor tracks and the strip-shaped conductors is preferably achieved by means of anisotropically conducting glue. The resulting connection is stable. The advantage of this solution in the body according to the invention is that a single flexible foil can suffice in principle, provided the signals on the conductor tracks permit this.

In a further modification, a connector is used for the contacting. Just as a flexible foil can be glued to the body, a connector may be joined to the body in an equally simple and effective manner.

A further possibility is that the body comprises a flexible portion. Such a flexible portion may be used for a specific connection to a component so as to adapt the body to the desired shape or to act as a contacting portion. Such a flexible portion is realized in that the insulating material is provided in more than one step, in each of which steps desired insulating materials are used such that a first portion is provided with an elastic insulating material and a second portion is provided with a hard, non-elastic insulating material. Such a process may be carried out with two molds, but alternatively also in one mold having two or more chambers. Examples of non-elastic materials are epoxides and filled thermoplastic materials. Examples of elastic materials are polyimide, benzocyclobutene, and non-filled thermoplastic materials.

The second object of the invention of providing an electronic device of the kind mentioned in the opening paragraph in which various functions for an apparatus can be integrated is realized in that the electrically insulating body according to the invention is present. The electrically insulating body according to the invention performs the functions of a carrier and of electrical contacting in the device. It may be manufactured in a desired shape here, rendering possible an optimum miniaturization of the electronic device. The invention furthermore has the advantages over a solution in which a conductor pattern is provided with glue on an insulating body that one assembling step less is required and that no glue remains behind afterwards. In addition, the conductor pattern may readily extend along side walls of cavities and openings, which is not possible, or at least not on an industrially acceptable scale, in the known solution.

An advantage of the electronic device is in particular that several components which have a functional interrelationship with one another can be provided on the insulating body without these components having to be at the same side of the body.

The device according to the invention furthermore offers a possibility of creating a separation between electronic elements and their electronic controls without two carriers being necessary for this, or without the controls being positioned between the functional elements, i.e. at an interface accessible to users. The functional elements may be present at the first side, and the electronic controls at the third side facing away from the first side. Furthermore, the carrier for the electronic controls may be connected to the carrier for the electronic elements by means of a flexible portion.

A further advantage of the device is that the elements to be assembled can be removed from the electronic body in a simple manner. This renders it possible to collect these elements separately when the device is no longer used. It is also possible for the elements to be detachably connected to the body. Furthermore, elements may be replaced in this manner, if this should be desirable for repairs or for upgrading the functions.

Examples of electronic elements are semiconductor elements, cameras, microphones, flat displays, loudspeakers, passive components, antennas, keyboards, and similar elements for mechanically indicating a number, a function, words, etc. A favorable combination is, for example, that of a display and a semiconductor element which serves as a control unit for the display. The connection via the conductor pattern of the body can be very short; at the same time it offers the possibility of locating the display and the semiconductor element separately in different places.

In a favorable embodiment, the electrically insulating body as defined in claim 4 is present, wherein the first component is a photosensitive semiconductor element and the second component is an optical lens, together defining a camera. The electronic body is thus used not only as a carrier and for electrical contacting, but also for defining the distance between the lens and the semiconductor element. In addition, a substantial miniaturization of the camera is realized in this manner.

In a further embodiment, a display is present which is electrically and mechanically connected to the electrically insulating body, and the conductor pattern is constructed such that signals from the photosensitive semiconductor element can be transmitted to the display. Signals from cameras, for example in mobile telephones, in video cameras, and in digital photographic devices, are to be passed on to a display. The entire visual chain from camera to display is present on one carrier in the device according to the invention. This renders it possible to manufacture and to test this device as an entity before it is dispatched to a customer. In addition, the integration of this visual chain offers the possibility of optimizing the associated video processing and to leave out complicated intermediate steps in the processing.

In a further embodiment, a second camera is present in the device, which camera comprises a lens and a photosensitive element, while the first camera is oriented towards the first side of the device, and the second camera is oriented towards the third side of the device. At least two cameras are present in the device according to the invention, oriented in opposite directions. The cameras are preferably fixed on a carrier body which is independent of the housing and by means of which at the same time electrical connections from and to the cameras are realized. The lenses and/or the photosensitive elements of the cameras may be different here, for example as regards focal distance and optical quality of the lens and resolution of the element, one camera being chosen to catch images from a short distance, in particular up to 1 m, and the other one being chosen for catching images from a longer distance, in particular 1 m and more.

It is particularly preferred that the electrically insulating body according to the invention is the carrier body for the cameras, such that the lens and the photosensitive element are on either side of the body, and an opening is present in the body between the lens and the element. The body is thus used for defining the distance, for providing mechanical support, and for electrical contacting. The carrier body is also highly suitable for fixing the camera mechanically to other support bodies or to the housing of an apparatus for mobile communication, such as a mobile telephone, a laptop computer, or a PDA. This may be implemented, for example, in that the carrier body is shaped so as to match the shape of the other bodies and/or housing, or has a shape complementary to the other carrier body. Particularly favorable is an embodiment in which the electrically insulating body is the carrier body for both the one and the other camera. The assembly is minimized thereby, the multilateral presence of the conductor pattern is utilized, and the mutual positioning of the cameras is safeguarded. The display may also be present on this shared carrier body, which simplifies the electrical control and contacting.

It is highly preferably, furthermore, for the apparatus to comprise means for switching the first and/or the second camera on and off, and means for showing or not showing images caught by the cameras on the display. These means may be in the form of keys, which enhances user-friendliness, or alternatively a menu or a button on the display that can be activated by means of a touchscreen.

The camera present at the side of the display is preferably located at the upper side thereof. Furthermore, this camera may be oriented with respect to the display by means of an adequate bending angle and an adequate definition of the shape of the electrically insulating body; i.e. an axis of the camera defined by the centers of the lens and of the element may enclose an angle of between 0 and 20° with the perpendicular on the display. This is advantageous because the camera is thus aimed at a user's face when the latter looks at the display.

The apparatus may also be provided with means by which the apparatus can be placed on a base surface, such as a stand, a rail, and the like, without the apparatus toppling over, and by which the apparatus is adjusted to a desired angle with respect to the base surface. A user may thus put the apparatus down, which is highly advantageous if the apparatus is used as a digital camera for panoramas and in particular in the case of video conferences.

The electronic device is used to advantage in an apparatus for mobile communication such as a mobile telephone, a laptop computer, and hybrid forms thereof. The advantage of this is an enhanced functionality and further miniaturization. A spatial separation between functional elements and electronic drive may be realized.

These and other aspects of the electrically insulating body, the electronic device, and the apparatus according to the invention will be explained in more detail with reference to the drawing, in which identical components have been given the same reference numerals and in which.

Figure 1:
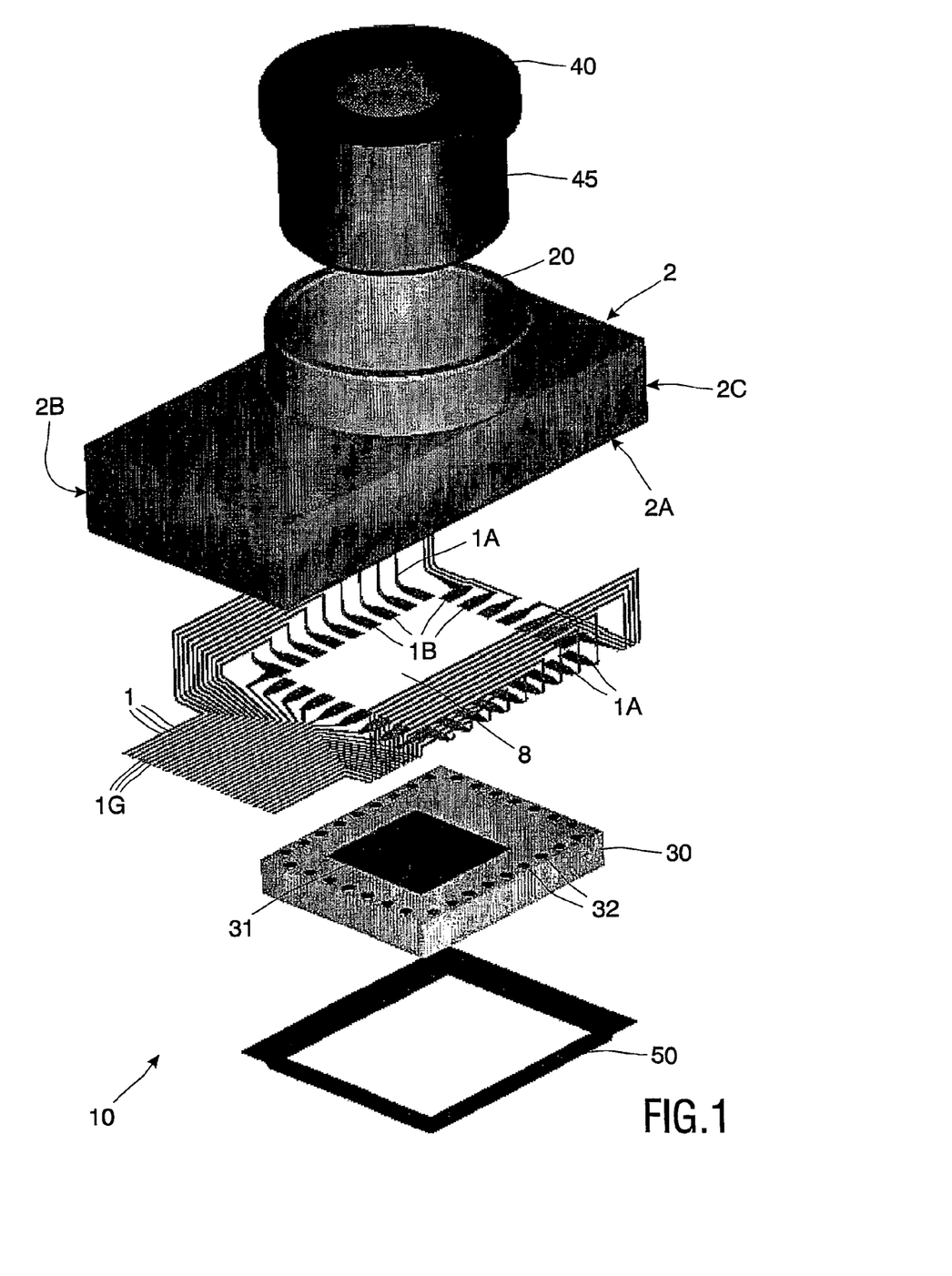
FIG. 1 is a diagrammatic, perspective, exploded view of a first embodiment of the device comprising a compact camera.
Figure 2:
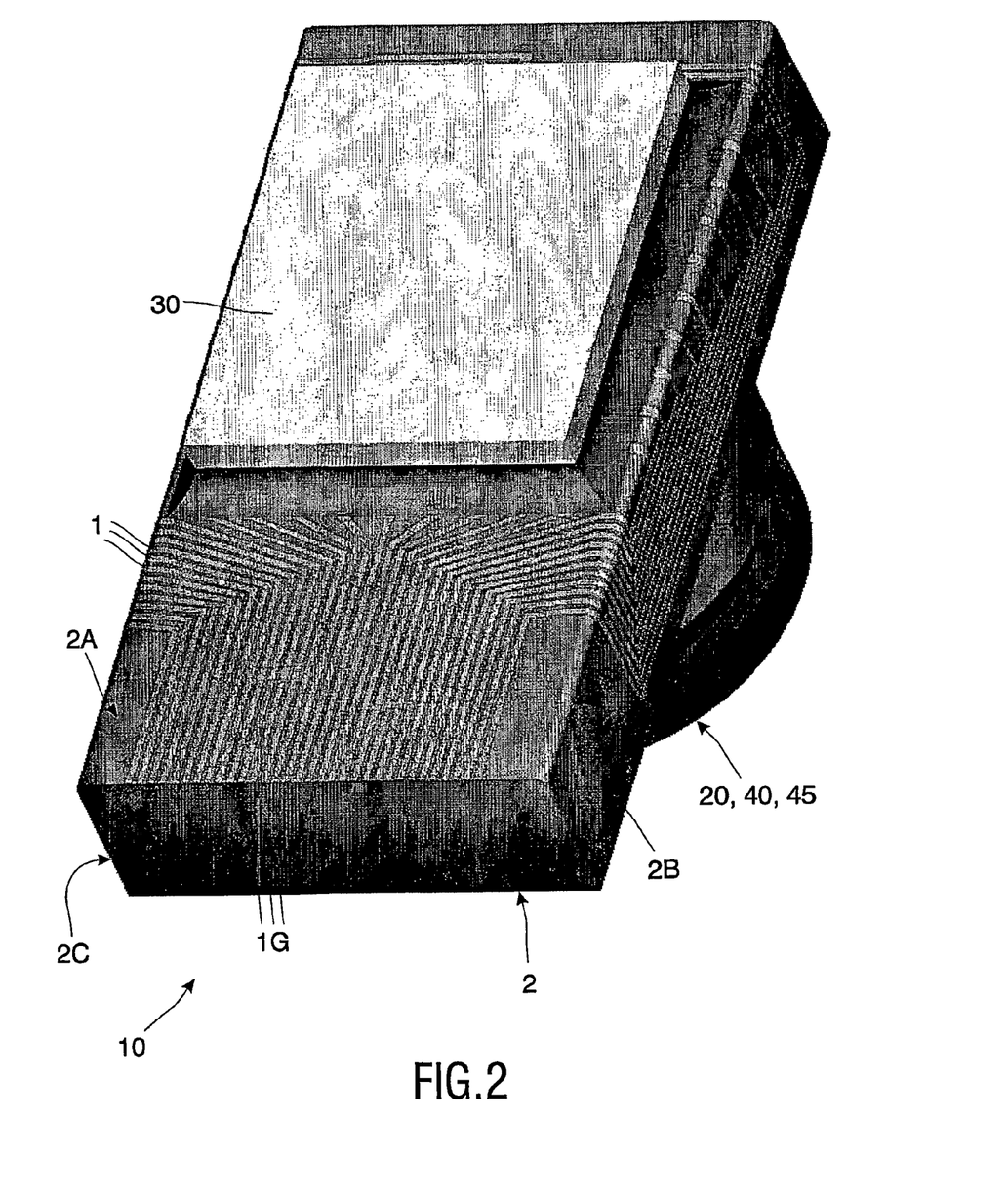
FIG. 2 is a diagrammatic perspective view of the device of FIG. 1 in the assembled state, rotated 180° with respect to the view of FIG. 1.

FIG. 1 is a diagrammatic, perspective, exploded view of an electronic device according to the invention comprising a compact camera. FIG. 2 diagrammatically shows this device in perspective view and in the assembled state at an angle of 180 degrees with respect to FIG. 4. The device 10—see, for example, FIG. 1—comprises a synthetic resin carrier body 2, made of PPS (=PolyPhenylene Sulphide) here, in which an opening 20 is present in which an optical lens 40 arranged in a cylindrical holder 45 is fastened. At the other side of the opening 20, a rectangular closed shape 8 of connection regions 1B present at respective ends 1A of strip-shaped conductors 1 is present on a flat surface 2A of the carrier body 2. The conductors 1 extend directly to the end of the surface 2A at one side of the closed shape 8, where accordingly the other ends 1C of the strip-shaped conductors 1 are present. The strip-shaped conductors 1 present at the other three sides of the closed shape 8 run partly over the surface 2A, but for the rest partly over two side faces 2B, 2C of the body 2 which are perpendicular to the surface 2A. The conductors 1 present at the rear of the closed shape 8 then distribute themselves over the two side faces 2B, 2C. The device 10 in this example can be particularly compact as a result of this. In addition, its manufacture is simple and inexpensive.

Furthermore, a photosensitive semiconductor element 30, a so-called CCD (=Charge Coupled Device) or CMOS (=Complementary Metal Oxide Semiconductor) sensor 30, is fastened against the surface 2A of the carrier body 2 by means of a frame 50. The photosensitive region 31A of the sensor 30 is then present opposite the opening 20 in the body 2, and the connection regions 32 of the sensor 30 are fastened with electrical conduction to connection regions 1B of the strip-shaped conductors 1 lying in the closed shape 8. FIG. 2 shows the device 10 once more from a different side, in the assembled state this time. The signals from the device 10 may be taken off and/or passed on at the ends 1C of the conductors 1, for example within a mobile telephone (not shown) for which the device 10 is particularly suitable because of its compactness in three directions.

The manufacture of such a device 16 in a favorable embodiment is diagrammatically shown in FIGS. 3 to 6.

Figure 3:
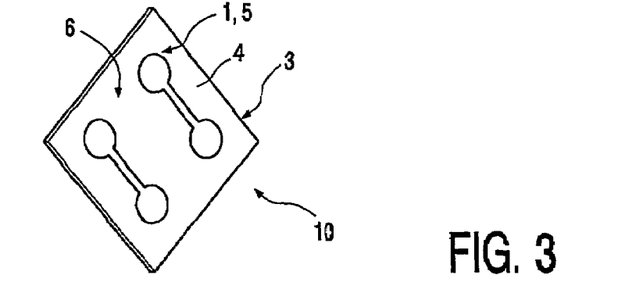
FIGS. 3 to 6 are diagrammatic perspective views of the body in consecutive stages of its manufacture.

FIG. 3 represents the starting point of the manufacture, a carrier plate 3 comprising a first layer 4, an aluminum layer 4 of 30 μm thickness here, on which a second, electrically conductive and thinner layer 5 is present, made of copper here and having a thickness of 10 μm. Thereon, i.e. on the second layer 5, a dumbbell-shaped mask of silicon dioxide is formed by photolithography, whereupon the copper of the second layer 5 is removed outside this mask by etching with an aqueous solution of ferrichloride, so that a recess 6 is formed in the carrier plate 3, which recess is finished here in that a further portion of the second layer 5 and also a portion of the first layer 4 of aluminum are removed by means of the same etchant.

Figure 4:
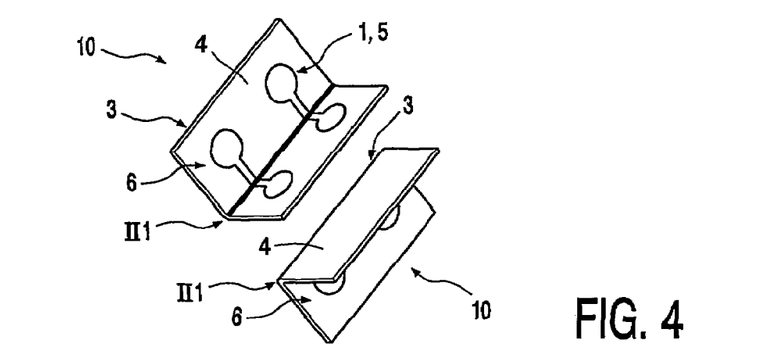

FIG. 4 shows a next step in the method, wherein the carrier plate 3 is bent. A linear groove L is provided for this purpose at the rear of the carrier plate 3 so as to facilitate bending of the carrier plate 3 through an angle of 90 degrees. The carrier plate is subsequently bent twice through approximately 90 degrees so as to form the flat side face 2A of the body 2 as well as two flat sides 2B, 2C which each enclose an angle of 90 degrees with the side face 2A. Electronic elements to be encapsulated in the body may now be placed in desired positions, as applicable. Examples are passive and active elements.

Figure 5:
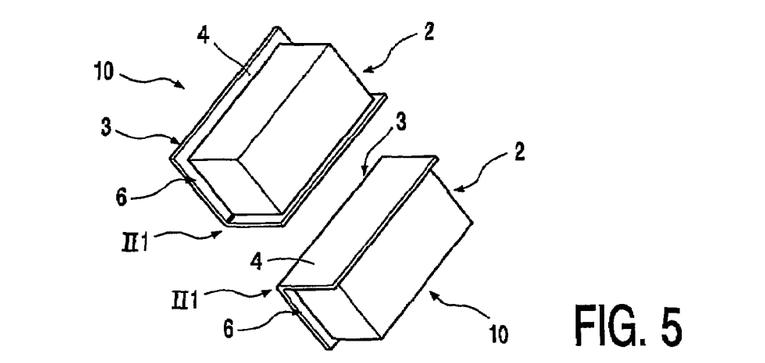

FIG. 5 shows the device after a next step. In this step, the device 10 is placed in a mold (not shown), whereupon the electrically insulating body 2 is formed by injection molding through the injection of, for example, PPS material against the carrier plate 3. The recess 6 is also filled up with a portion of the body 2. Then so much is removed from the carrier plate 3 from the side of the first layer 4, by means of etching in this case, that the recess 6 filled with a portion of the body 2 is reached. The entire first layer 4 is removed in this example.

Figure 6:
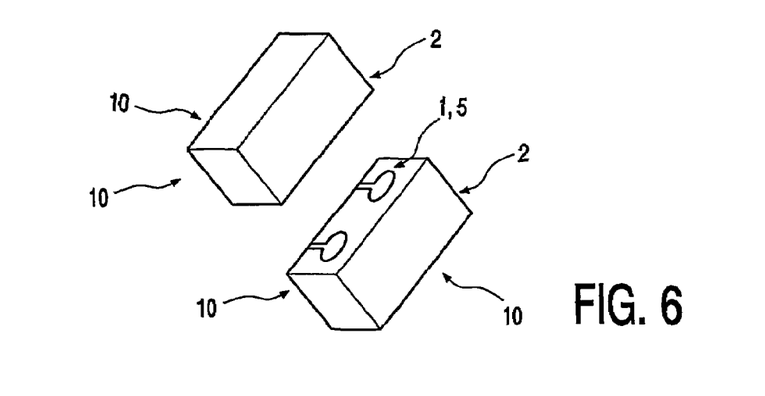

FIG. 6 shows the device 10 according to the invention thus obtained, with an insulating body 2 with the conductor pattern 1 recessed in the surface thereof and extending over two adjoining, in this example mutually perpendicular side faces. The conductor pattern in this example comprises a circular portion at one end, which is highly suitable for electrical contacting of an electronic element by means of solder or glue. The electrically insulating body 2 then acts as a carrier for the conductor pattern and also as a carrier for the electronic element.

The manufacture of the device according to the invention is not limited to the method as described in the embodiment. It is important for the manufacture to be based on a carrier plate that can be bent and that comprises a conductor pattern. It is favorable then that the first layer of the carrier plate forms a mechanical support which is removed after the provision of the insulating material. A recessing and anchoring of the conductor pattern in the body is additionally obtained with the embodiment as described above. Alternative embodiments, however, are equally conceivable. Alternative materials may be used especially for the carrier plate, i.e. for the layers forming part thereof. The insulating body may also be formed from various alternative materials, such as (a slurry of) a ceramic material or an epoxy synthetic resin material.

Figure 7:
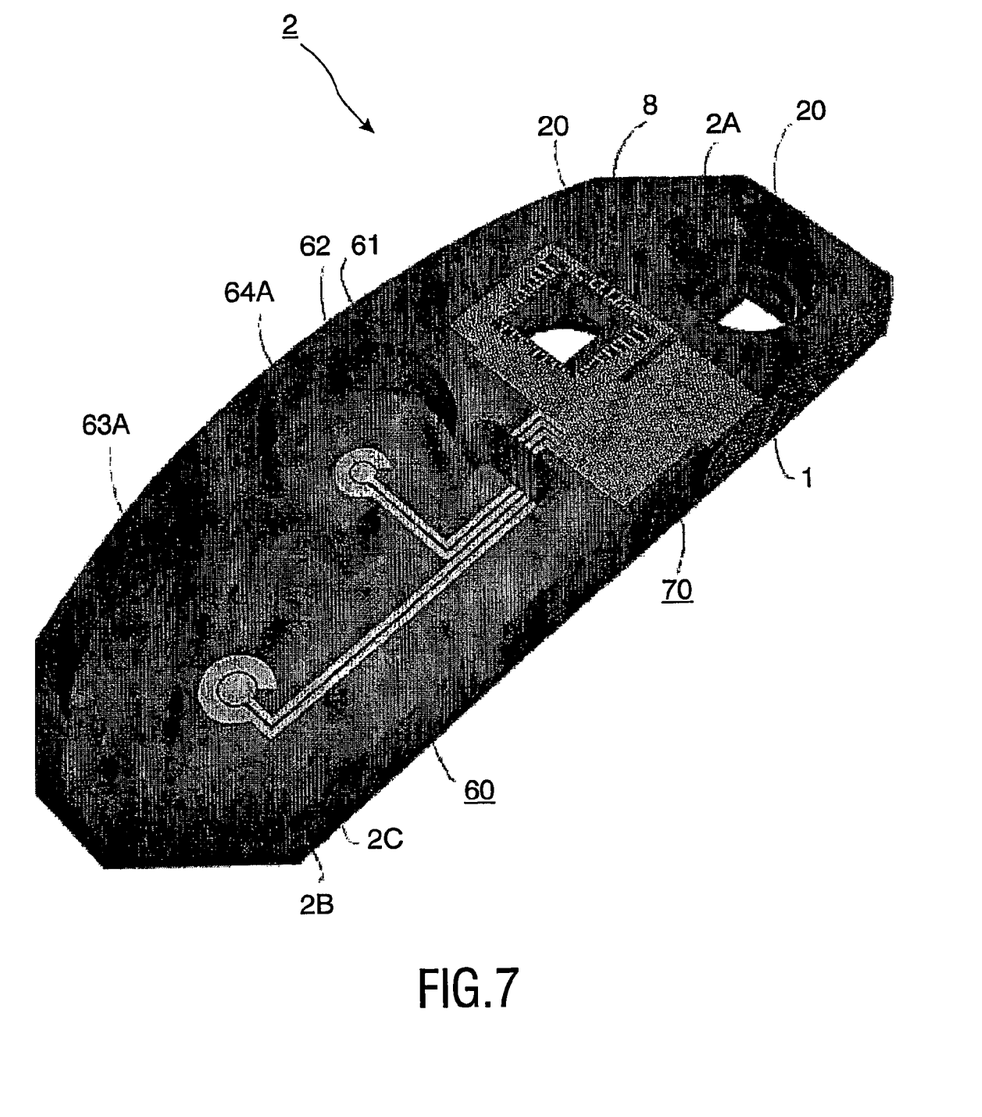
FIG. 7 shows a second embodiment of the body in a diagrammatic perspective view.
Figure 8:
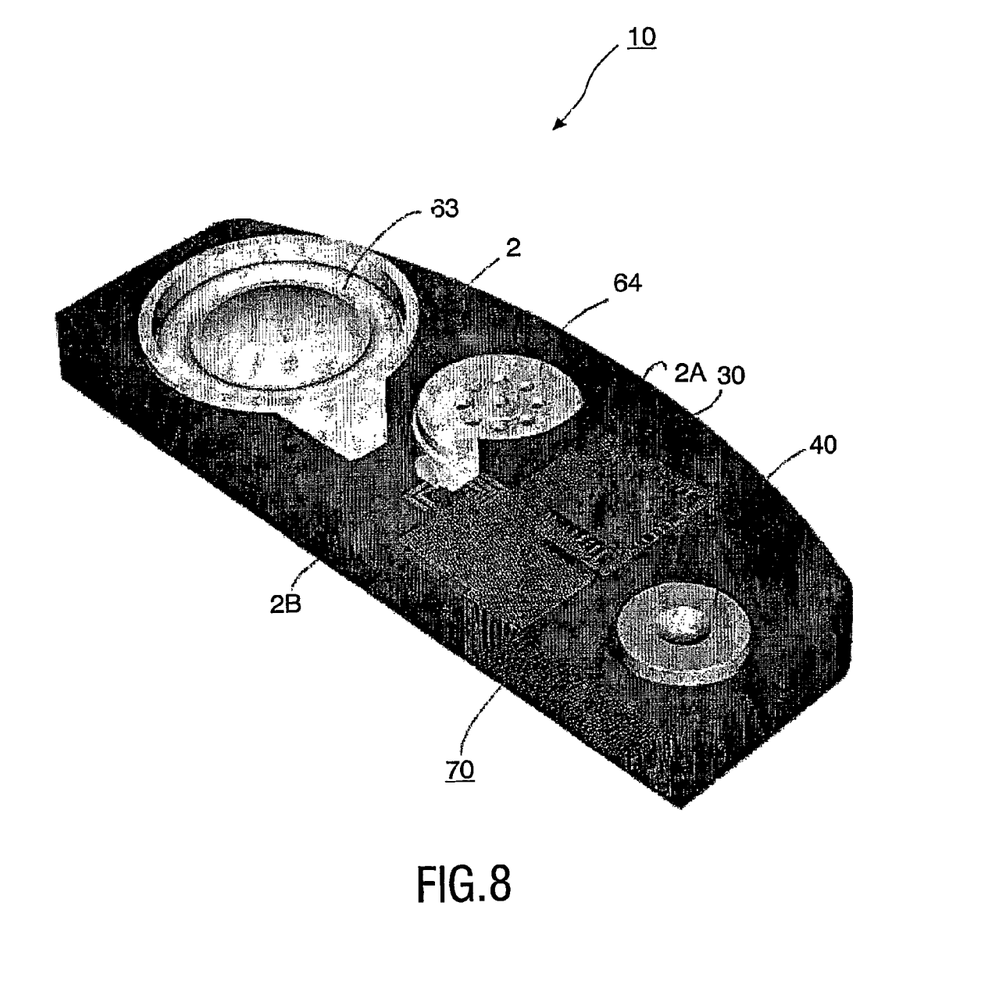
FIG. 8 shows a second embodiment of the device comprising the body shown in FIG. 7 in a diagrammatic perspective view.

FIG. 7 shows a further embodiment of the electrically insulating body 2 according to the invention. FIG. 8 shows the corresponding electronic device 10. The body is manufactured in the manner described with reference to FIGS. 3 to 6, a mold having a desired shape being used. This procedure yields not only openings 20, but also a cavity 60 with a side wall 61 and a bottom 62, the conductor pattern extending up to the bottom 62. The cavity 60 is suitable for accommodating elements such as a loudspeaker 63 and a buzzer 64, as shown in FIG. 6. The device 10 is further provided with two lenses 40 and two photosensitive semiconductor elements 30 which are aligned to mutually remote sides 2A, 2C of the device 10. One lens 40 and one photosensitive semiconductor element 30 then form the camera together with the interposed electrically insulating body. To realize this, the conductor pattern extends from the first side 2A via the second side 2B to the third side 2C.

Electrical contacting to the outer world is necessary for controlling all electronic elements in a suitable manner. This contacting is realized with a flexible foil (not shown) which is connected to a contacting region 70 on which ends 71 of conductors 1 are present in a substantially parallel arrangement. It is noted that the conductors 1 come from various elements 30, 63, 64. The conductors 1 preferably have a width of the order of 20 to 50 μm and are preferably spaced apart by between 40 and 80 μm. It is further noted that the conductor tracks may have different widths outside the contacting region 70; in the embodiment the conductors 1 to the buzzer and the loudspeaker have a width of approximately 200 μm, each such track ending in three conductors 1 in the contacting region 70.

Figure 9:
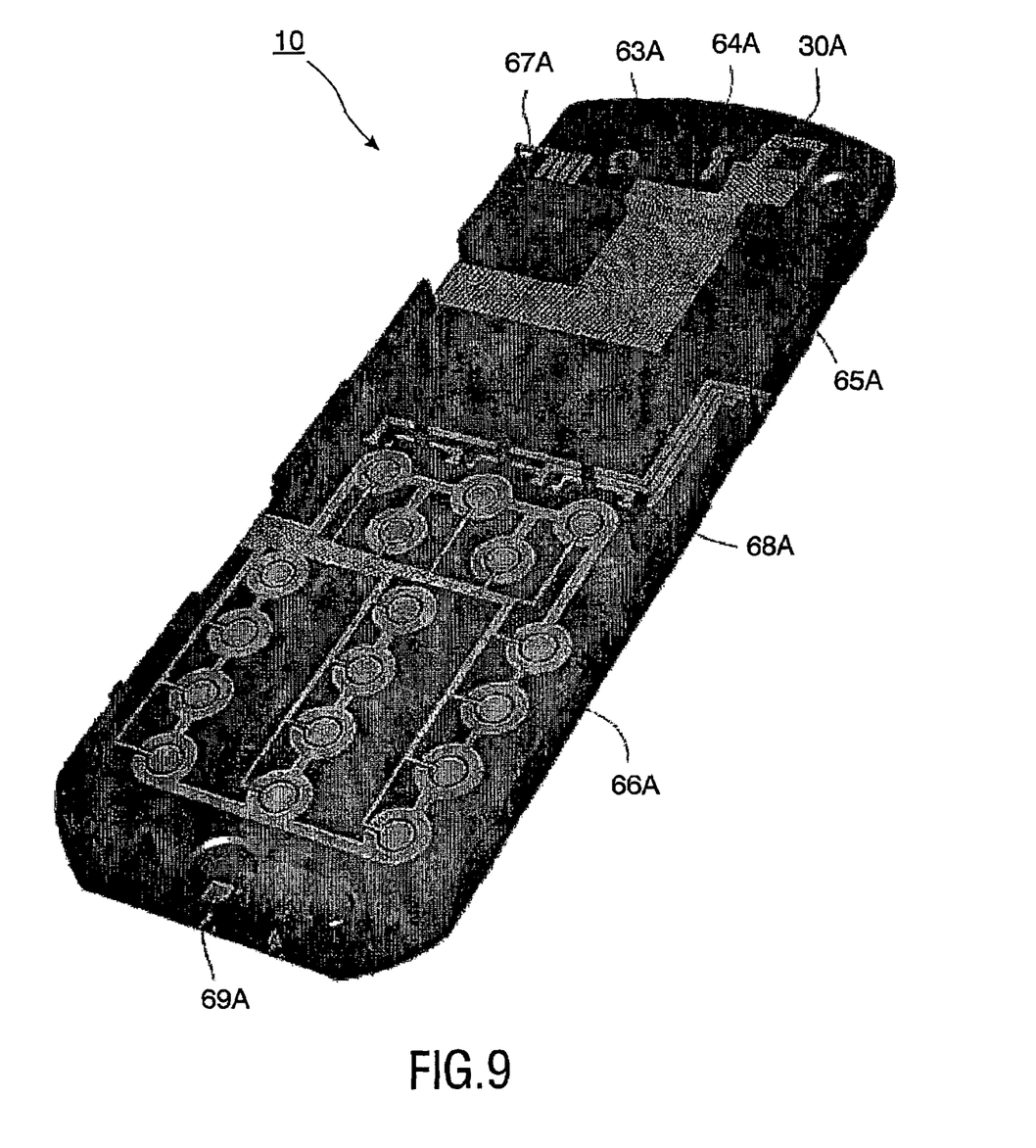
FIG. 9 shows a third embodiment of the body in a diagrammatic perspective view.
Figure 10:
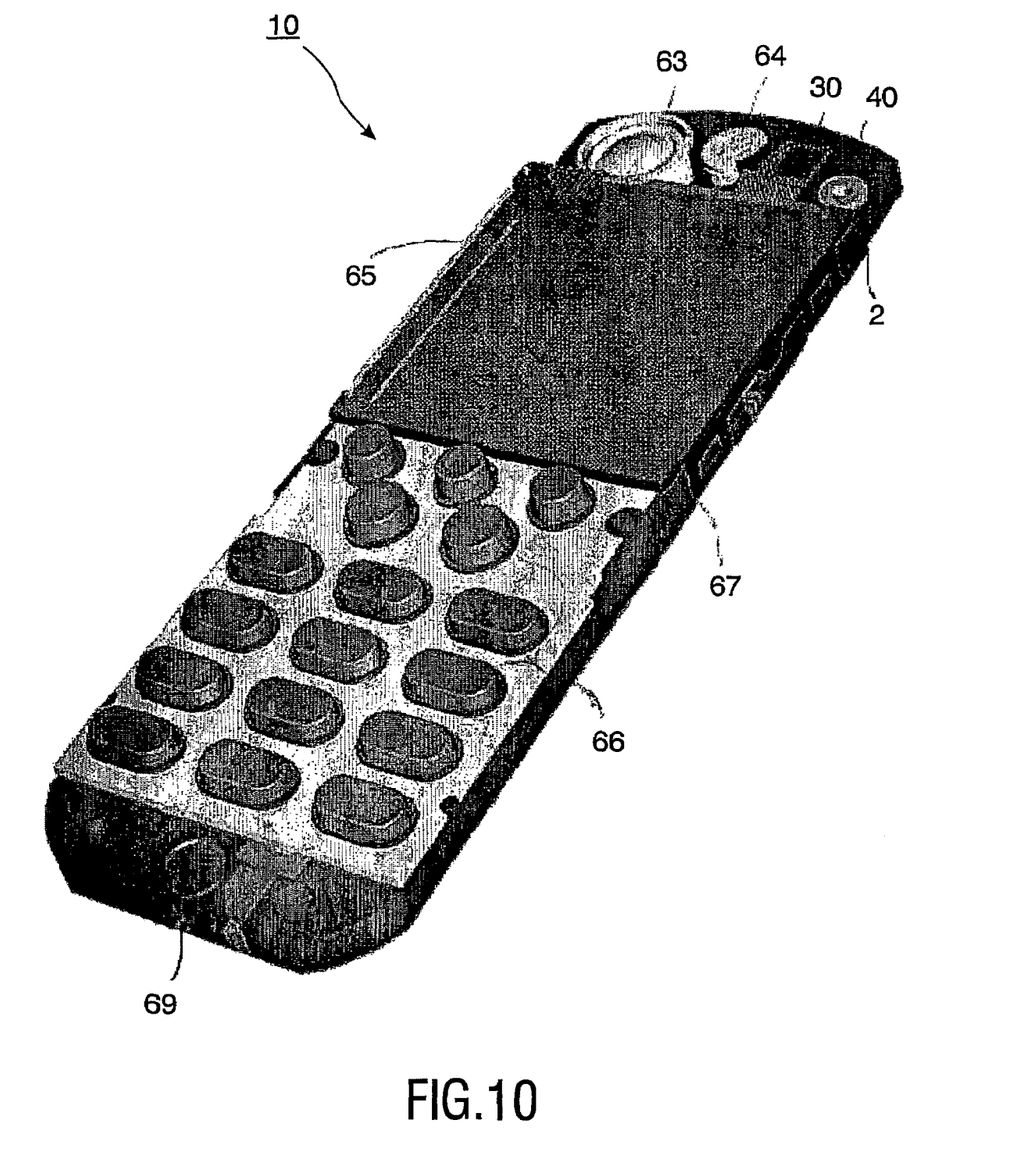
FIG. 10 is a diagrammatic perspective view of a third embodiment of the device comprising the body of FIG. 9.

FIG. 9 shows a third embodiment of the electrically insulating body 2 according to the invention, and FIG. 10 shows a corresponding electronic device 10. The body in this example is the carrier for a large number of desired electronic elements of a mobile telephone. These are in particular the elements which provide the interface to the user. At the rear side 2C (not shown) of the body 2, conductors 1 provide interconnections between the elements, and connection regions are present for the placement of elements which implement the required control functions. It is also possible for a contacting region for a flexible foil or a connector to be defined at that side. Connections are present for a semiconductor element of a camera, a loudspeaker 63, a buzzer 64, a display 65, keys 66, a touchscreen 67, lamps 68 (preferably light-emitting diodes), and a microphone 69, FIG. 9 showing the connections of the elements by their reference numerals followed by A (for example 30A). It is noted that the body has the advantage that a direct connection between (the semiconductor elements 30 of) the cameras and the picture screen 65 and the keys 66 and/or the touchscreen 67 is also possible without connections having to be realized by means of connectors or flexible foils. The number of connections may thus be advantageously reduced, and the camera 41 and picture screen 65 can be mutually attuned in the assembly.

It is further noted that the conductors 1 in this embodiment lie in a recess at a side 2B, whereby possible damage is prevented. Such damage, however, is improbable anyway when such a manufacturing method is used, which leads to a recessed position of the conductor pattern.

The conductor pattern providing the drive of the touchscreen 67 comprises a flexible portion in this embodiment. This is formed in that a portion of the carrier plate is provided with an elastic synthetic resin such as polyimide instead of PPS. Connectors and flexible connections between two portions of the body 2 may also be integrated in this manner.

The invention claimed is:

1. An electrically insulating body provided with a conductor pattern, which insulating body is provided with a first and a second side between which an enclosed angle is present of substantially less than 180 degrees, wherein the conductor pattern extends over and is recessed in the first and the second side, wherein the conductor pattern comprises a number of strip-shaped conductors provided each with at least one region of larger dimensions than the width of the strip-shaped conductors, which regions are suitable for electrical contacting of electronic elements to be assembled together with the insulating body, said body acting as a carrier of the conductor pattern and as a carrier of the elements, and wherein the body further has a third side which faces away from the first side, and the conductor pattern extends from the first side over the second side onto the third side.

2. An electrically insulating body as claimed in claim 1, characterized in that a cavity or opening is present in the body for mounting an electronic element.

3. An electrically insulating body as claimed in claim 2, characterized in that the cavity has a bottom and a side wall, the conductor pattern extending over the side wall and optionally over the bottom of the cavity, while a connection region for electrical contacting of the electronic element is present in the cavity.

4. An electrically insulating body as claimed in claim 2, characterized in that the opening extends from the first side through to a third side facing away from the first side, such that a first component can be placed at the first side and a second component can be placed at the third side, which components together with the interposed body define an electronic element.

5. An electrically insulating body as claimed in claim 1, characterized in that at least a number of the strip-shaped conductors is provided with respective regions at respective ends, which regions act as connection regions and are located in a closed, preferably rectangular arrangement.

6. An electrically insulating body as claimed in claim 1, characterized in that at least a number of the strip-shaped conductors have respective strip-shaped ends, said ends being at least substantially oriented in parallel and present at the first side.

7. An electrically insulating body as claimed in claim 1, characterized in that the strip-shaped conductors have a width of between 10 and 500 μm.

8. An electronic device provided with an electronic element and with an electrically insulating body provided with a conductor pattern as claimed in claim 1.

9. An electronic device provided with an electronic element and with an electrically insulating body provided with a conductor pattern as claimed in claim 4, wherein the first component is a photosensitive semiconductor element and the second component is an optical lens, together defining a camera.

10. An electronic device as claimed in claim 9, characterized in that a display is present which is electrically and mechanically connected to the electrically insulating body, and the conductor pattern is constructed such that signals from the photosensitive semiconductor element can be transmitted to the display.

11. An apparatus for mobile communication provided with an electronic device as claimed in claim 8.

12. An electrically insulating body as claimed in claim 4, characterized in that at least a number of the strip-shaped conductors is provided with respective regions at respective ends, which regions act as connection regions and are located in a closed, preferably rectangular arrangement.

13. An electronic device as claimed in claim 1, wherein the number of strip-shaped conductors extend over and are recessed in the first side and the second side of the body.

* * * * *